United States Patent
Kubota (10) Patent No.: US 11,527,869 B2
(45) Date of Patent: Dec. 13, 2022

(54) LIGHT-EMITTING MODULE AND MANUFACTURING METHOD THEREOF, AND SURFACE-EMITTING LASER

(71) Applicant: SUMITOMO ELECTRIC INDUSTRIES, LTD., Osaka (JP)

(72) Inventor: Ryosuke Kubota, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 225 days.

(21) Appl. No.: 17/023,523

(22) Filed: Sep. 17, 2020

(65) Prior Publication Data

US 2021/0111541 A1  Apr. 15, 2021

(30) Foreign Application Priority Data

Oct. 10, 2019 (JP) .............................. JP2019-187062

(51) Int. Cl.
| | |
|---|---|
| H01S 5/42 | (2006.01) |
| H01S 5/02253 | (2021.01) |
| H01S 5/02216 | (2021.01) |
| H01S 5/183 | (2006.01) |
| H01S 5/042 | (2006.01) |
| H01S 5/343 | (2006.01) |
| H01S 5/02 | (2006.01) |
| H01S 5/40 | (2006.01) |

(52) U.S. Cl.
CPC ............ *H01S 5/423* (2013.01); *H01S 5/0207* (2013.01); *H01S 5/02216* (2013.01); *H01S 5/02253* (2021.01); *H01S 5/04252* (2019.08); *H01S 5/04256* (2019.08); *H01S 5/18313* (2013.01); *H01S 5/18347* (2013.01); *H01S 5/18361* (2013.01); *H01S 5/34313* (2013.01); *H01S 5/34353* (2013.01); *H01S 5/4087* (2013.01)

(58) Field of Classification Search
CPC .... H01S 5/423; H01S 5/0207; H01S 5/02253; H01S 5/4087
See application file for complete search history.

(56) References Cited

U.S. PATENT DOCUMENTS

| | | | | |
|---|---|---|---|---|
| 5,640,188 | A * | 6/1997 | Andrews | B41J 2/473 347/245 |
| 2011/0044369 | A1* | 2/2011 | Andry | G02B 6/4204 257/E31.127 |
| 2011/0274131 | A1* | 11/2011 | Takaki | H01S 5/423 372/50.124 |
| 2018/0183540 | A1 | 6/2018 | O'Daniel | |

OTHER PUBLICATIONS

"Datacon 2200 Evo;" Besi Netherlands B.V. pp 1-2; https://www.besi.com/products-technology/product-details/product/datacon-2200-evo/#ttabs-57.
"Laser Application;" Disco Corporation; pp. 1-7; https://www.disco.co.jp/jp/products/catalog/pdf/laser.pdf.

* cited by examiner

*Primary Examiner* — Yuanda Zhang
(74) *Attorney, Agent, or Firm* — Oliff PLC (57) ABSTRACT

A light-emitting module includes a substrate, a first surface-emitting laser mounted on the substrate, the first surface-emitting laser having a first engaging portion protruded outward at an end, and a second surface-emitting laser mounted on the substrate, the second surface-emitting laser having a second engaging portion recessed inward at an end. The first surface-emitting laser and the second surface-emitting laser are adjacent to each other. The first engaging portion and the second engaging portion are engaged with each other.

7 Claims, 11 Drawing Sheets

FIG. 11B

LIGHT-EMITTING MODULE AND MANUFACTURING METHOD THEREOF, AND SURFACE-EMITTING LASER

CROSS-REFERENCE TO RELATED APPLICATION

This application is based upon and claims the benefit of priority of the prior Japanese Patent Application No. 2019-187062, filed on Oct. 10, 2019, the entire contents of which are incorporated herein by reference.

FIELD

The present invention relates to a light-emitting module, a manufacturing method thereof, and a surface-emitting laser.

BACKGROUND

U.S. Patent Application Publication No. 2018/0183540 discloses an optical device having a plurality of vertical-cavity surface-emitting lasers (VCSELs) and lenses.

SUMMARY

A light-emitting module according to one aspect the present disclosure includes a substrate, a first surface-emitting laser mounted on the substrate, the first surface-emitting laser having a first engaging portion protruded outward at an end thereof, and a second surface-emitting laser mounted on the substrate, the second surface-emitting laser having a second engaging portion recessed inward at an end thereof. The first surface-emitting laser and the second surface-emitting laser are adjacent to each other. The first engaging portion and the second engaging portion are engaged with each other.

A method of manufacturing the light-emitting module according to the present disclosure includes the steps of placing a first surface-emitting laser on the substrate, the first surface-emitting laser having a first engaging portion protruded outward at the end thereof, and placing a second surface-emitting laser on the substrate, the second surface-emitting laser having a second engaging portion recessed inward at the end thereof. In the step of placing the second surface-emitting layer, the second surface-emitting laser is placed so that the first engaging portion and the second engaging portion are engaged with each other.

A surface-emitting laser according to the present disclosure includes a lower reflector layer, an active layer, and an upper reflector layer stacked in this order, and an engaging portion provided at an end of the surface-emitting laser. The engaging portion includes an apex or an arc.

DESCRIPTION OF EMBODIMENTS

A light-emitting module may include a plurality of surface-emitting lasers. In order to obtain a desired light output, it is preferable to accurately position the surface-emitting laser. However, an accuracy of the position of the surface-emitting laser may be reduced after/when errors of the position of the individual surface-emitting laser are added together. Accordingly, an object of the present disclosure is to provide a surface-emitting laser capable of improving the accuracy of the position of the surface-emitting laser and a method for manufacturing such a surface-emitting laser.

First, the contents of embodiments of the present invention will be described by enumerating.

An embodiment of the present disclosure is (1) a light-emitting module including: a substrate, a first surface-emitting laser mounted on the substrate, the first surface-emitting laser having a first engaging portion protruded outward at an end thereof; and a second surface-emitting laser mounted on the substrate, the second surface-emitting laser having a second engaging portion recessed inward at an end thereof. The first surface-emitting laser and the second surface-emitting laser are adjacent to each other. The first engaging portion and the second engaging portion are engaged with each other. By the first engaging portion and the second engaging portion is engaged, it is possible to accurately position the first surface-emitting laser and the second surface-emitting laser.

(2) The light-emitting module may include optical components disposed above the he first surface-emitting laser and the second surface-emitting laser. The optical components may receive lights emitted from the first surface-emitting laser and the second surface-emitting laser. Since the first surface-emitting laser and the second surface-emitting laser are accurately positioned, an accuracy of an alignment between the first and second surface-emitting lasers and the optical components is also improved.

(3) Each of the first surface-emitting laser and the second surface-emitting laser may have an emitting portion from which light is emitted. The optical components may include a first lens and a second lens. The first lens is located above the emitting portion of the first surface-emitting laser, and the second lens is located above the emitting portion of the second surface-emitting laser. By the accuracy of the position of the first surface-emitting laser and the second surface-emitting laser is improved, the accuracy of the alignment between the first surface-emitting laser and the second surface-emitting laser and the first lens and the second lens is also improved.

(4) The first surface-emitting laser may have an oscillation wavelength different from an oscillation wavelength of the second surface-emitting laser. The light-emitting module having a plurality of oscillation wavelengths can be formed.

(5) The light-emitting module may have a third surface-emitting laser having a third engaging portion at an end thereof. The second surface-emitting laser may have a fourth engaging portion at an end thereof different from the end provided with the second engaging portion. The third engaging portion may be recessed inward or protruded outward from the third surface-emitting laser. The fourth engaging portion may be protruded or recessed outward from the second surface-emitting laser. The second surface-emitting laser and the third surface-emitting laser are adjacent to each other. The third engaging portion and the fourth engaging portion may be engaged with each other. The accuracy of the position of a plurality of surface-emitting lasers is improved.

(6) The first engaging portion of the first surface-emitting laser and the second engaging portion of the second surface-emitting laser may have one of an apex and an arc. The fourth engaging portion of the second surface-emitting laser and the third engaging portion of the third surface-emitting laser may have the other of the apex and the arc. It is possible to suppress the confusion of the surface-emitting laser.

(7) An embodiment of the present disclosure is a method of manufacturing a light-emitting module including steps of: placing a first surface-emitting laser on a substrate, the first surface-emitting layer having a first engaging portion protruded outward at an end thereof; and placing a second surface-emitting laser on the substrate, the second surface-emitting laser having a second engaging portion recessed inward at an end thereof. In the step of placing the second surface-emitting laser, the second surface-emitting laser is placed so that the first engaging portion and the second engaging portion are engaged with each other. Since the first engaging portion and the second engaging portion is engaged, it is possible to accurately position the first surface-emitting laser and the second surface-emitting laser on the substrate.

(8) The method of manufacturing the light-emitting module may further include a step of arranging optical components above the first surface-emitting laser and the second surface-emitting laser. Each of the first surface-emitting laser and the second surface-emitting laser has an emitting portion from which light is emitted. The optical component may include a first lens and a second lens adjacent to each other. In the step of arranging the optical components, the first lens is positioned above the emitting portion of the first surface-emitting laser, and the second lens is positioned above the emitting portion of the second surface-emitting laser. By the accuracy of the position of the first surface-emitting laser and the second surface-emitting laser is improved, the accuracy of an alignment between the first surface-emitting laser and the second surface-emitting laser and the optical component is also improved. In addition, the number of man-hours can be reduced.

(9) An embodiment of the present disclosure is a surface-emitting laser including a lower reflector layer, an active layer, and an upper reflector layer stacked in order, and an engaging portion provided at an end of the surface-emitting laser. The engaging portion may be an apex or an arc. The accuracy of the position of the surface-emitting laser is improved.

DETAILS OF EMBODIMENTS OF THE PRESENT DISCLOSURE

Specific examples of a light-emitting module, a manufacturing method thereof, and a surface-emitting laser according to embodiments of the present invention will be described below with reference to the drawings. It should be noted that the present invention is not limited to these examples, but is indicated by the claims, and all changes that come within the meaning and range of equivalency of the claims are intended to be embraced therein.

First Embodiment (Light-Emitting Module)

Figure 1A:
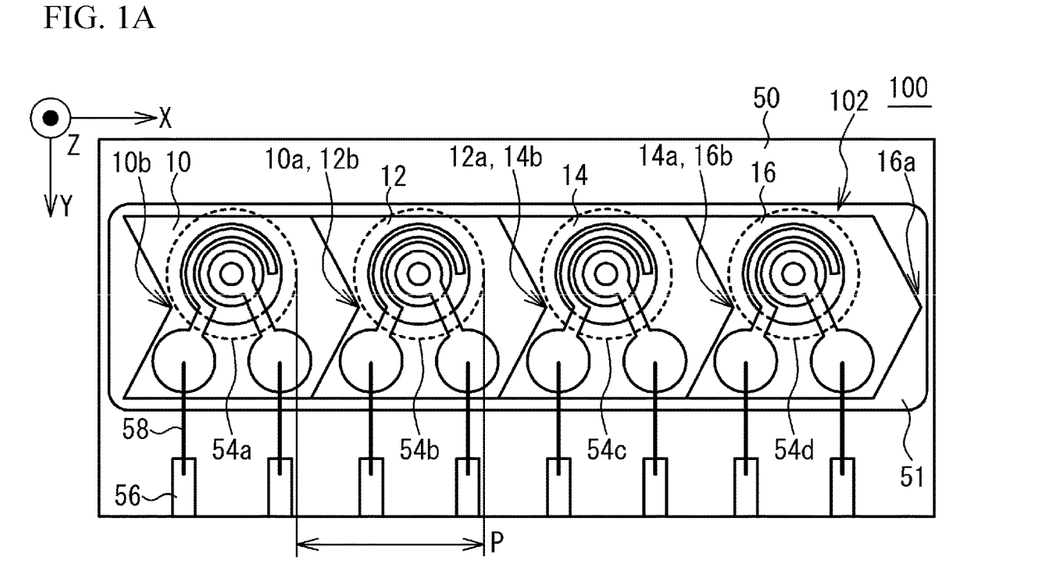
FIG. 1A is a plan view illustrating a light-emitting module according to a first embodiment.
Figure 1B:
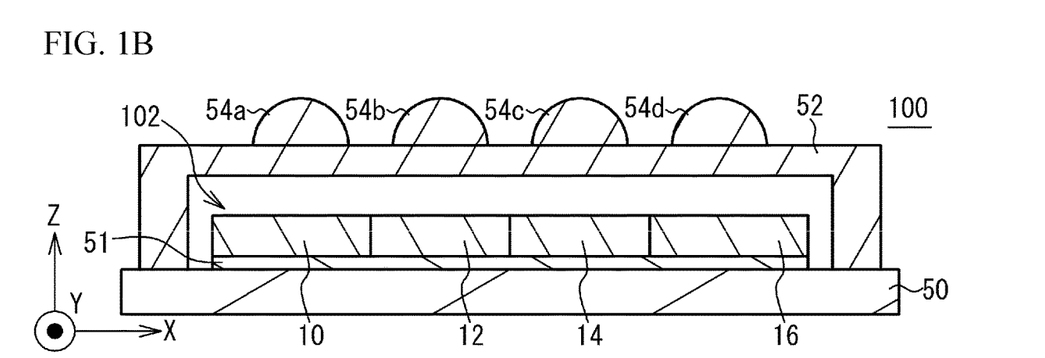
FIG. 1B is a cross-sectional view illustrating the light-emitting module.

FIG. 1A is a plan view illustrating a light-emitting module 100 according to a first embodiment, and FIG. 1B is a cross-sectional view illustrating the light-emitting module 100. An X-axis direction, a Y-axis direction and a Z-axial direction are orthogonal to each other. As illustrated in FIG. 1A and FIG. 1B, the light-emitting module 100 includes an array chip 102, a substrate 50, a carrier 52, lenses 54a to 54d, and terminals 56. In FIG. 1A, the carrier 52 and the lenses 54a to 54d are illustrated in a perspective view and the lenses 54a to 54d are illustrated in dotted lines.

As illustrated in FIG. 1A and FIG. 1B, the array chip 102 is fixed to a surface of the substrate 50 by a silver paste 51. The array chip 102 includes four surface-emitting lasers 10, 12, 14 and 16 that are sequentially aligned along the X-axis direction. The carrier 52 is disposed on the surface of the substrate 50 and covers the array chip 102. The carrier 52 is provided with the four lenses 54a to 54d. A plurality of the terminals 56 are provided on the substrate 50. A plurality of pads of the array chip 102 are electrically connected by bonding wires 58 to the terminals 56 of the substrate 50. The substrate 50 is, for example, a printed circuit board.

(Surface-Emitting Laser)

Figure 2A:
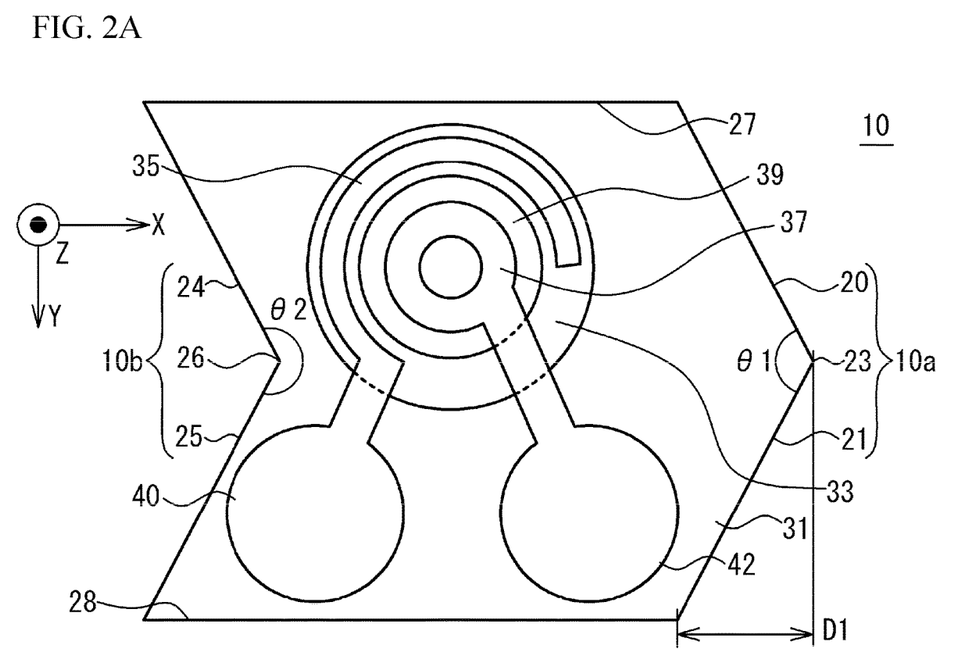
FIG. 2A is a plan view illustrating a surface-emitting laser.

FIG. 2A is a plan view illustrating the surface-emitting laser 10. As illustrated in FIG. 2A, sides 27 and 28 of the surface-emitting laser 10 are opposed to each other and extend in the X-axis direction. The lengths of the sides 27 and 28 are, for example, 250 µm, and equal to each other. An engaging portion 10a is provided at an end of an +X side of the surface-emitting laser 10. The engaging portion 10a includes sides 20 and 21 and an apex 23. The sides 20 and 21 are inclined relative to the sides 27 and 28. The apex 23 is located between the sides 20 and 21 and protruded outward (+X side) from the surface-emitting laser 10. More specifically, the apex 23 is protruded outward (+X side) from an imaginary straight line connecting ends of the +X side of the sides 27 and 28. The angle θ1 of the apex 23 in the XY plane is, for example, 146°. The angle θ1 is smaller than 180°.

An engaging portion 10b is provided at an end of an −X side. The engaging portion 10b includes sides 24 and 25 and an apex 26. The sides 24 and 25 are inclined with respect to the sides 27 and 28. The apex 26 is located between the sides 24 and 25 and is recessed inward (+X side) from the surface-emitting laser 10. More specifically, the apex 26 is recessed inward (+X side) from an imaginary straight line connecting ends of the −X side of the sides 27 and 28. The angle θ2 of the apex 26 is, for example, 214°. The angle θ2 is greater than 180°.

For example, the sides 20 and 24 are parallel to each other, the sides 21 and 25 are parallel to each other, and the lengths of the sides 20, 21, 24 and 25 are, for example, 136 µm, and equal to each other. The distance D1 from the ends of the +X sides of the sides 27 and 28 to the apex 23 is, for example, 40 μm. The distance from the ends of the −X sides of the sides 27 and 28 to the apex 26 is equal to the distance D1.

A mesa 39, electrodes 35 and 37, and pads 40 and 42 are provided in the plane of the surface-emitting laser 10. The electrodes 35 and the pad 40 are electrically connected. The electrodes 37 and the pad 42 are electrically connected. The mesa 39 functions as an emitting portion for emitting laser light. The mesa 39 is surrounded by a groove 33, and a terrace 31 is provided outside the groove 33.

Figure 2B:
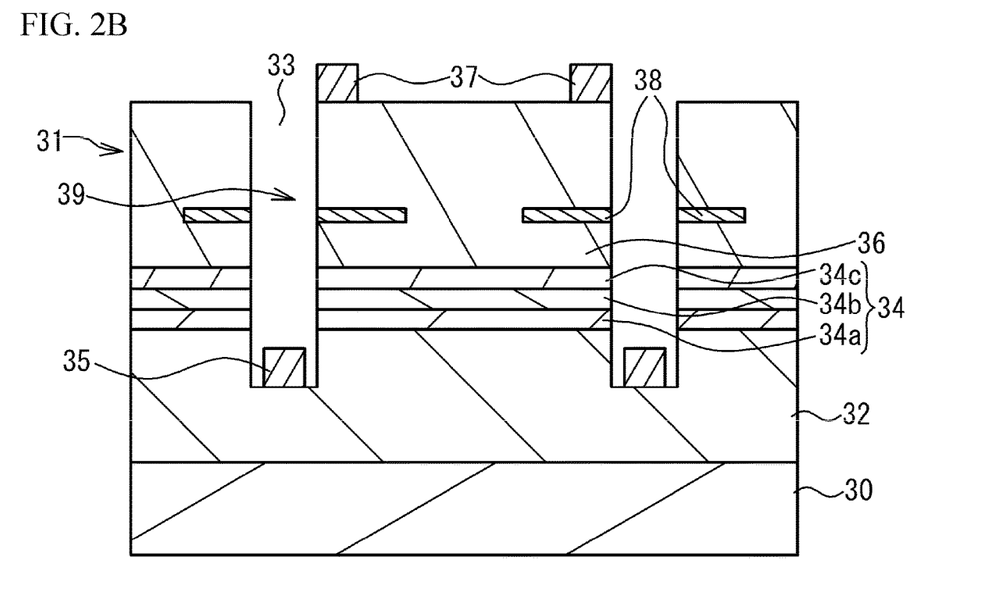
FIG. 2B is a cross-sectional view illustrating the surface-emitting laser.

FIG. 2B is a cross-sectional view illustrating the surface-emitting laser 10. As illustrated in FIG. 2B, the surface-emitting laser 10 includes a lower reflector layer 32 ("reflector" being technically defined as distributed Bragg reflector (DBR)), a cavity layer 34, and an upper reflector layer 36 stacked in order on a wafer 30. The cavity layer 34 includes a spacer layer 34a, a light-emitting layer 34b, and a spacer layer 34c which are stacked in the order.

The mesa 39 and the terrace 31 include the lower reflector layer 32, the cavity layer 34, and the upper reflector layer 36. The mesa 39 is surrounded by the groove 33 having, for example, a depth of 5 μm. The terrace 31 is provided outside the groove 33. The groove 33 extend from the upper reflector layer 36 to the middle of the lower reflector layer 32. The electrodes 35 are provided in the groove 33 and on the lower reflector layer 32. The electrodes 37 are provided on the mesa 39 and on the upper reflector layer 36.

An oxide confinement layer 38 is provided on the upper reflector layer 36 and extends from the side surface of the mesa 39 toward the center. The oxide confinement layer 38 includes, for example, aluminum oxide ($Al_2O_3$), is insulating, and thus allows less current to flow therethrough than the unoxidized portion Therefore, an unoxidized portion on the center side of the upper reflector layer 36 becomes a current path, and efficient current injection becomes possible. The oxide confinement layer 38 is also provided in the terrace 31.

The wafer 30 is a semiconductor substrate formed of semi-insulating gallium arsenide (GaAs) having a thickness of, for example, 100 μm. The thickness of the portion excluding the wafer 30 of the surface-emitting laser 10 is, for example, several tens of μm. The lower reflector layer 32 is a semiconductor-multilayered film containing n-type $Al_{0.16}Ga_{0.84}As$ and $Al_{0.9}Ga_{0.1}As$ doped with, for example, silicon (Si). These AlGaAs layers are alternately stacked, each having an optical thickness of λ/4. Incidentally, λ is an oscillation wavelength of the surface-emitting laser 10. The lower reflector layer 32 is doped with, for example, silicon (Si).

The light-emitting layer 34b has, for example, a multiple quantum well (MQW) structure composed of alternately stacked well layers of InGaAs and barrier layers of AlGaAs, and has an optical gain. The spacer layers 34a and 34c are formed of, for example, AlGaAs.

The upper reflector layer 36 is, for example, a semiconductor-multilayered film containing p-type $Al_{0.16}Ga_{0.84}As$ and $Al_{0.9}Ga_{0.1}As$ doped with carbon (C). These AlGaAs layers are alternately stacked, each having an optical film thickness of λ/4. The upper reflector layer 36 and the lower reflector layer 32 may include AlGaAs contact layers, each in contact with the electrodes. The wafer 30, the lower reflector layer 32, the cavity layer 34, and the upper reflector layer 36 may be formed of other compound semiconductors.

The electrodes 35 are n-type electrodes having, for example, a stack of gold-germanium (AuGe) and nickel (Ni). The electrodes 37 are p-type electrodes having, for example, a laminated structure of titanium (Ti), platinum (Pt), and Au. The electrodes 35 and 37 may be formed of a metal capable of ohmic contact with the lower reflector layer 32 and the upper reflector layer 36, respectively. The pads 40 and 42 illustrated in FIG. 2A include metals such as Au. Surface-emitting lasers 12, 14 and 16 have the same configuration as the surface-emitting laser 10. In a plurality of surface-emitting lasers, the same configuration as that of the mesa 39 or the like may be denoted by the same reference numerals.

As illustrated in FIG. 1A, the engaging portion 10a of the +X side of the surface-emitting laser 10 and an engaging portion 12b of the −X side of the surface-emitting laser 12 are engaged with each other. More specifically, the protruding apex 23 of the engaging portion 10a and the recessed apex of the engaging portion 12b come in contact with each other. The angle θ1 of the apex 23 is equal to the outer angle between the two sides of the engaging portion 12b. The side 20 of the engaging portion 10a and a corresponding side of the engaging portion 12b is in contact, and the side 21 of the engaging portion 10a and a corresponding side of the engaging portion 12b is in contact. The surface-emitting laser 10 and the surface-emitting laser 12 form a single plane without a gap.

Similarly, the engaging portion 12a of a +X side of the surface-emitting laser 12 and an engaging portion 14b of a −X side and the surface-emitting laser 14 are engaged with each other. An engaging portion 14a of a +X side of the surface-emitting laser 14 and the engaging portion 14a and an engaging portion 16b of a −X side of the surface-emitting laser 16 are engaged with each other.

The lens 54a as illustrated in FIG. 1A and FIG. 1B is positioned above the surface-emitting laser 10, the lens 54b is positioned above the surface-emitting laser 12, the lens 54c is positioned above the surface-emitting laser 14, and the lens 54d is positioned above the surface-emitting laser 16. Each lens overlaps the mesa of the corresponding surface-emitting laser. The lenses have diameters of, for example, 200 μm and a numerical aperture (NA) of 0.3. The pitch P between adjacent lenses is equal to the pitch between mesas of adjacent surface-emitting lasers, and is, for example, 250 μm.

By applying a voltage from the terminals 56 of the substrate 50 illustrated in FIG. 1A to a pad of the surface-emitting laser, the cavity layer 34 of the surface-emitting laser emits light in the Z-axis direction. The oscillation wavelengths of the four surface-emitting lasers 10, 12, 14 and 16 may be different from each other or may be equal to each other. The four oscillation wavelengths are, for example, 850 nm, 880 nm, 910 nm, and 940 nm. Each of an emitted light of the four surface-emitting lasers is emitted to the outside of the light-emitting module 100 through the corresponding lens. In order to obtain the desired light output, accurate positioning of the surface-emitting laser and accurate alignment of the lens with respect to the surface-emitting laser are important.

(Method of Manufacturing a Light-Emitting Module)

FIG. 3A to FIG. 5B are cross-sectional views illustrating a manufacturing method of a surface-emitting laser 10. FIG. 6A to FIG. 8B are plan views illustrating a manufacturing method of the surface emitting laser 10. FIG. 7A to FIG. 8B are plan views illustrating a manufacturing method of the light-emitting module 100.

Figure 3A:
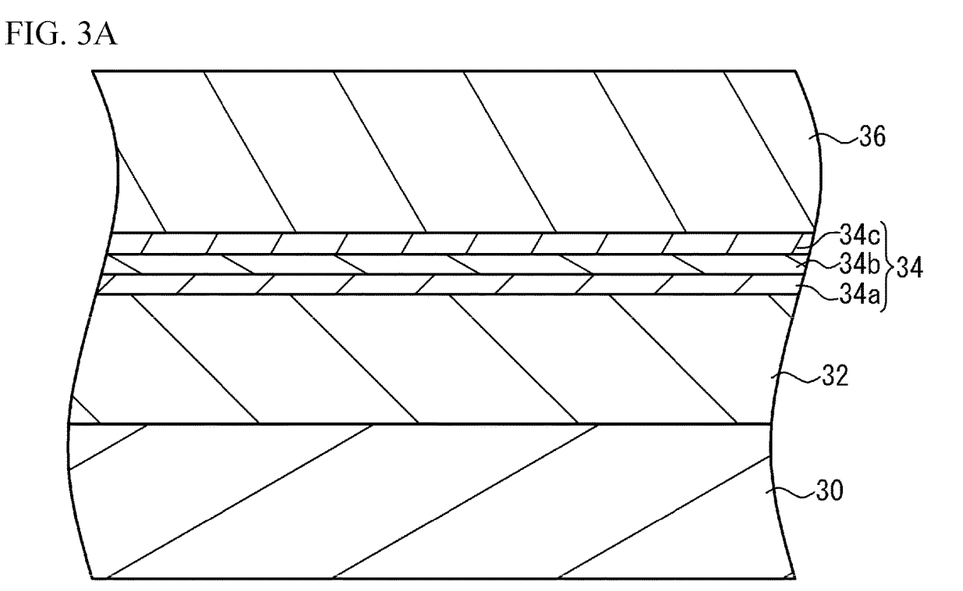
FIG. 3A and FIG. 3B are cross-sectional views illustrating a manufacturing method of a surface-emitting laser.

FIG. 3A to FIG. 8B illustrate a method of manufacturing the surface-emitting laser 10. As illustrated in FIG. 3A, the lower reflector layer 32, the cavity layer 34, and the upper reflector layer 36 are epitaxially grown on the wafer 30 by, for example, a metal-organic chemical vapor deposition (MOCVD) method or a molecular beam epitaxy (MBE) method. The upper reflector layer 36 includes an $Al_xGa_{1-x}As$ layer (0.9≤x≤1.0) for forming the oxide confinement layer 38. After the epitaxial growth, ions such as hydrogen ions may be implanted into a portion of the lower reflector layer 32, the cavity layer 34, and the upper reflector layer 36 to form a high resistance region.

Figure 3B:
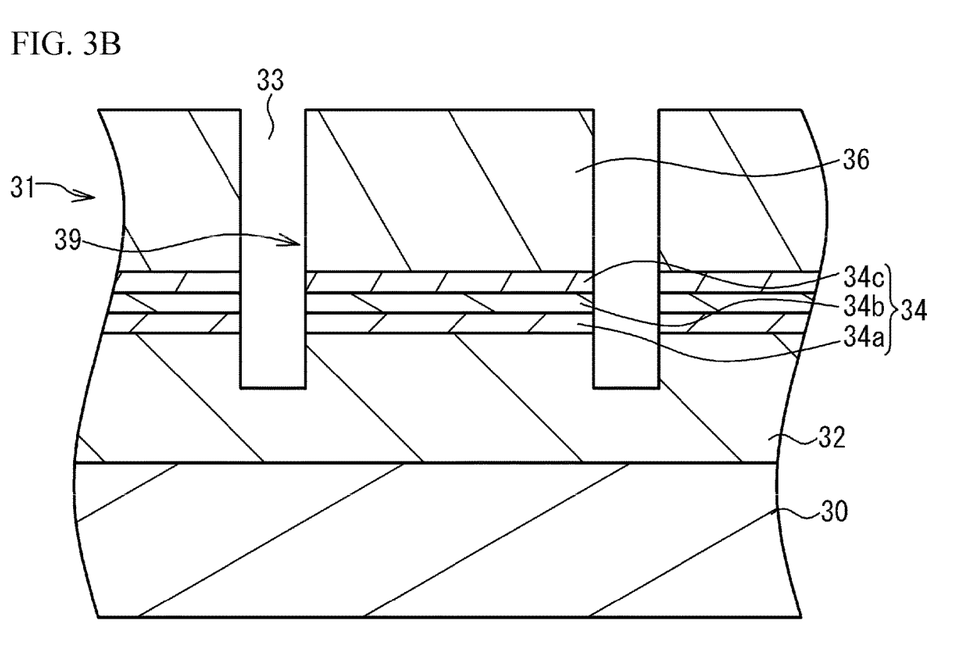

As illustrated in FIG. 3B the groove 33 is formed by dry etching or the like, the mesa 39 is formed inside the groove 33, and the terrace 31 is formed outside the groove 33. The portion protected by a photoresist (not shown) becomes the terrace 31 or the mesa 39, and the portion exposed from the photoresist is etched.

Figure 4A:
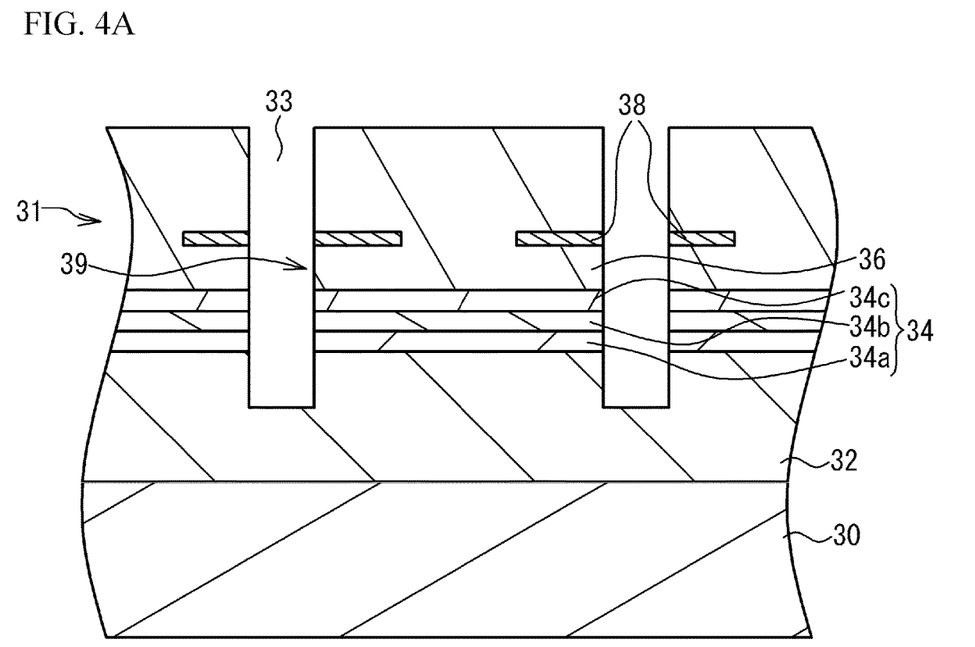
FIG. 4A and FIG. 4B are cross-sectional views illustrating a manufacturing method of a surface-emitting laser.
Figure 4B:
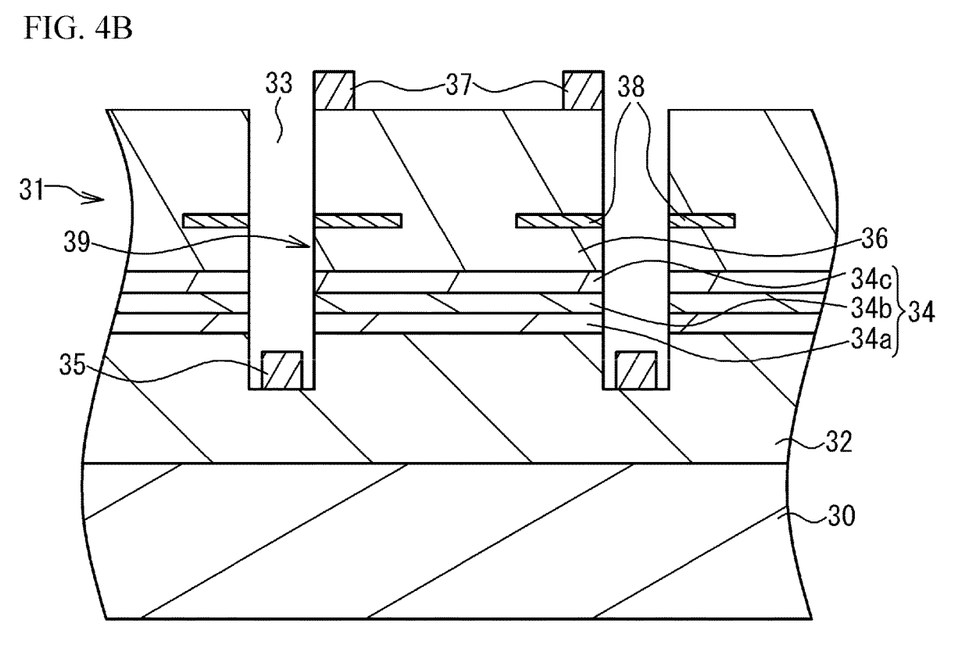

As illustrated in FIG. 4A, a portion of the upper reflector layer 36 is oxidized from the end by heating it to about 400° C. in, for example, a steam atmosphere to form the oxide confinement layer 38. As illustrated in FIG. 4B, the electrodes 35 are formed on the surface of the lower reflector layer 32 by, for example, resist patterning and vacuum evaporation methods, and the electrodes 37 are formed on the surface of the upper reflector layer 36. The pads 40 and 42 are formed, which are illustrated in FIG. 2A, but not in FIG. 4B.

Figure 5A:
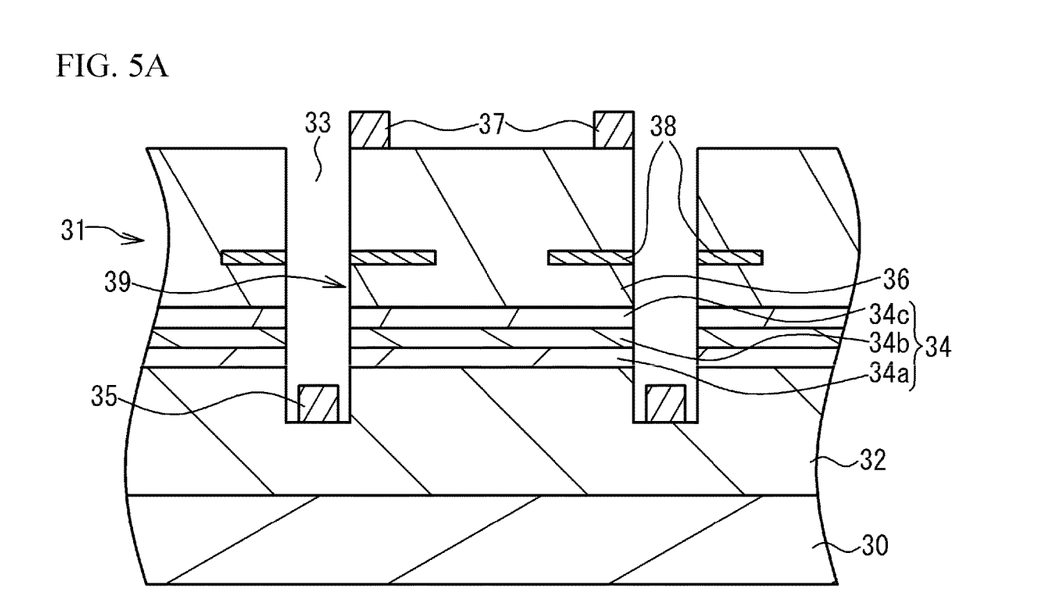
FIG. 5A and FIG. 5B are cross-sectional views illustrating a manufacturing method of a surface-emitting laser.

As illustrated in FIG. 5A, the back surface of the wafer 30 is polished by using a back grinder or a lapping device to reduce the thickness of the wafer 30 to about 100 μm to 200 μm.

Figure 5B:
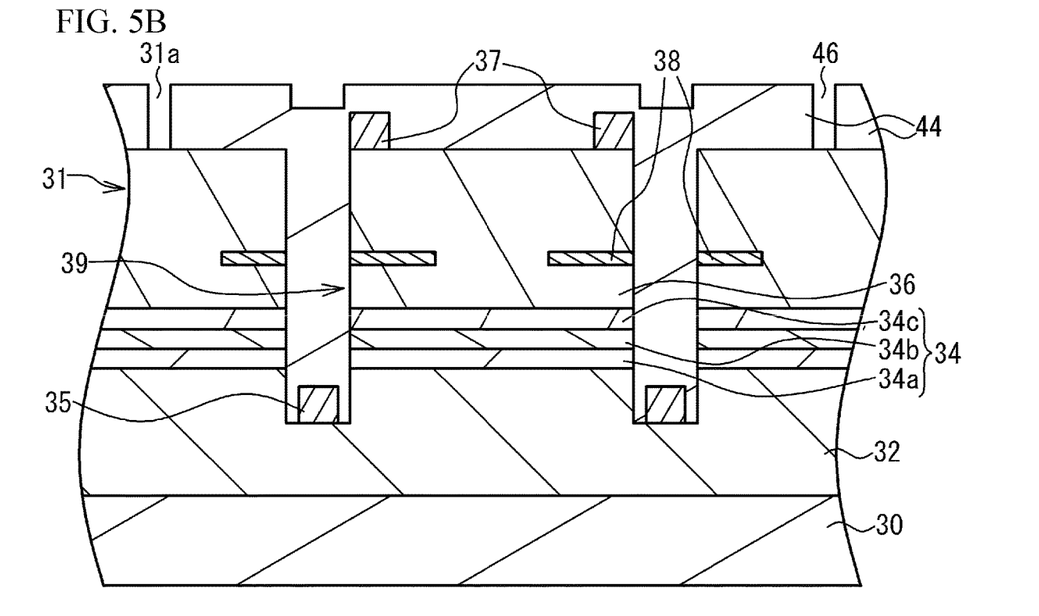
Figure 6A:
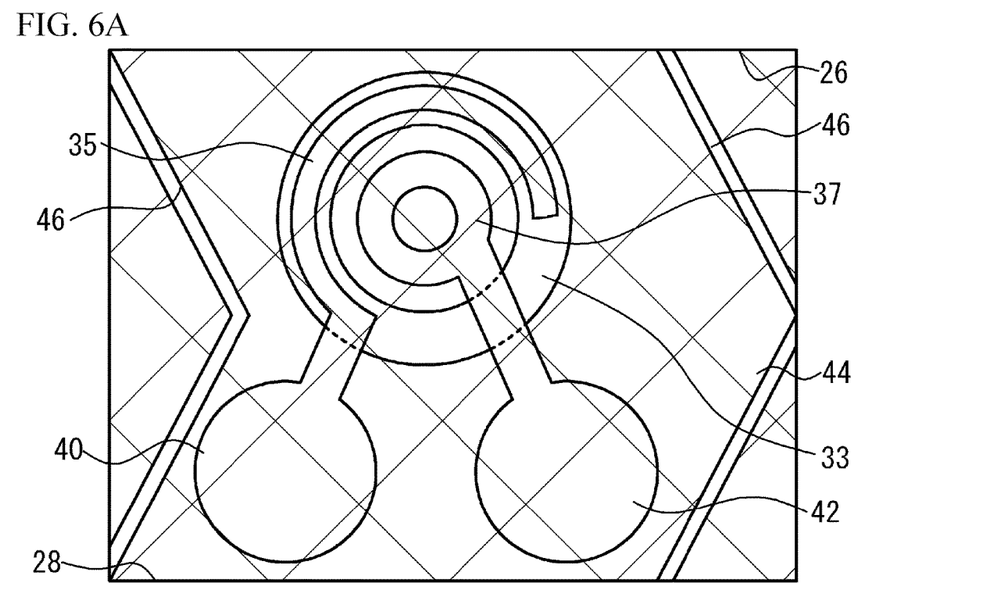
FIG. 6A and FIG. 6B are plan views illustrating a manufacturing method of a surface-emitting laser.
Figure 6B:
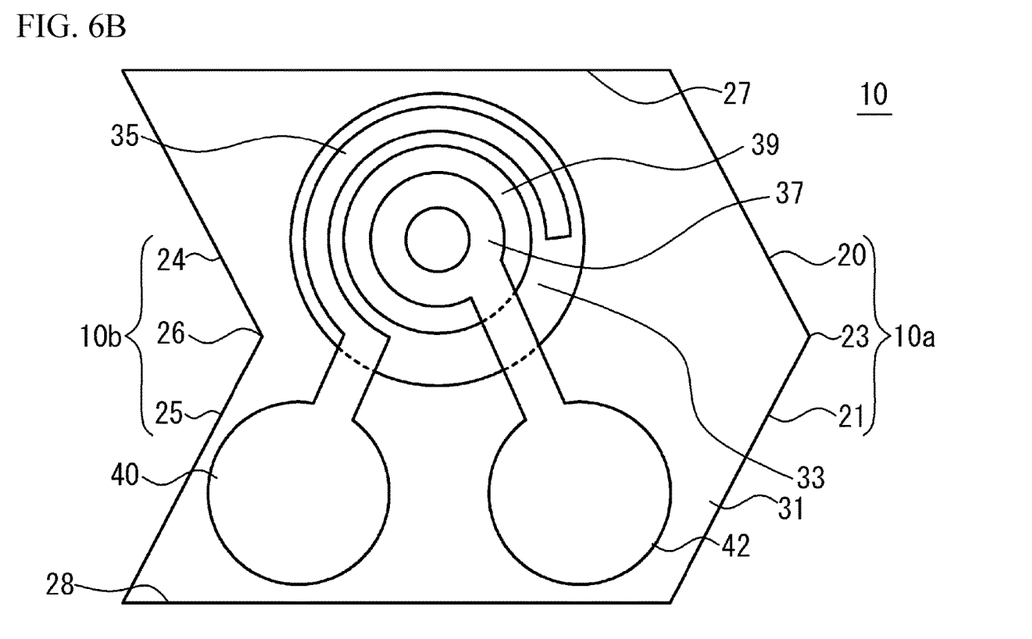

A mask 44 covering the terrace 31, the groove 33 and the mesa 39 is provided as illustrated in FIG. 5B and FIG. 6A. As illustrated in FIG. 6A, the mask 44 has a planar shape corresponding to the engaging portions 10a and 10b illustrated in FIG. 2A. A portion of the terrace 31 exposed from the mask 44 serves as a dicing line 46. The width of the dicing line 46 is, for example, 30 μm. The terrace 31 is cut at the dicing line 46 by, for example, laser dicing or the like. Thus the surface-emitting laser 10 illustrated in FIG. 2A and FIG. 2B are formed.

One type of surface-emitting lasers having one oscillation wavelength are manufactured from one wafer. That is, the surface-emitting lasers 12, 14 and 18 each having a different oscillation wavelength are manufactured from three wafers different from the wafer the surface-emitting laser 10 is manufactured by performing the same steps as described above. Surface-emitting lasers cut out from each wafer are tested, and a non-defective product is mounted on the substrate 50.

Figure 7A:
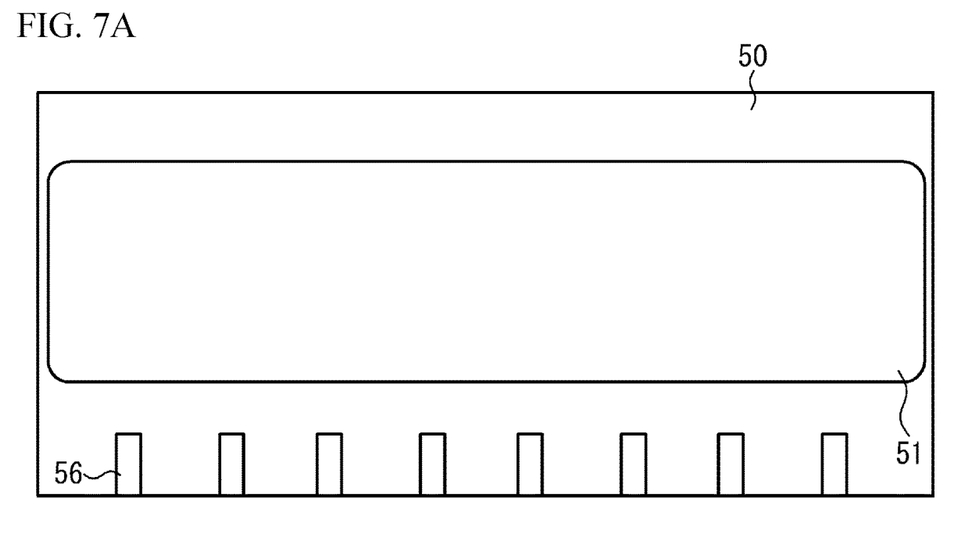
FIG. 7A and FIG. 7B are plan views illustrating a manufacturing method of a light-emitting module.
Figure 7B:
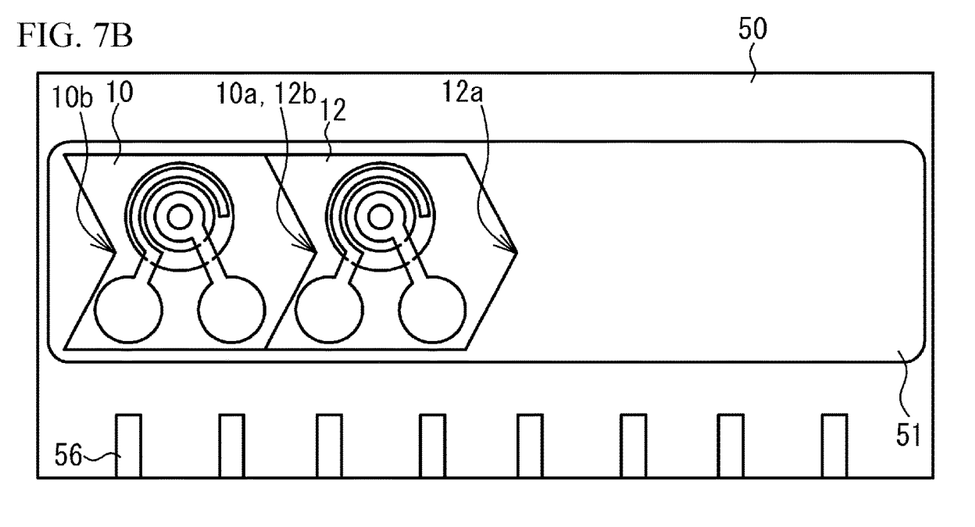

FIG. 7A to FIG. 8B illustrate mounting of the surface-emitting lasers and the lenses to the substrate 50. An adhesive such as the silver paste 51 is applied to a surface of the substrate 50 as illustrated in FIG. 7A. A plurality of surface-emitting lasers are arranged on the silver paste 51 in sequence as illustrated in FIG. 7B. For example, the surface-emitting laser 10 is arranged first, and then the surface-emitting laser 12 is arranged. The position of the surface-emitting laser 12 is determined by bringing the engaging portion 12b of the surface-emitting laser 12 into contact with the engaging portion 10a of the surface-emitting laser 10. Since the silver paste 51 before solidification has fluidity, the surface-emitting laser can be moved slightly on the silver paste 51. In order to bring the engaging portions into contact with each other, the surface-emitting laser 12 may be slid toward the surface-emitting laser 10 on the silver paste 51. Damage due to collision of the protruding engaging portion 12a can be prevented.

Figure 8A:
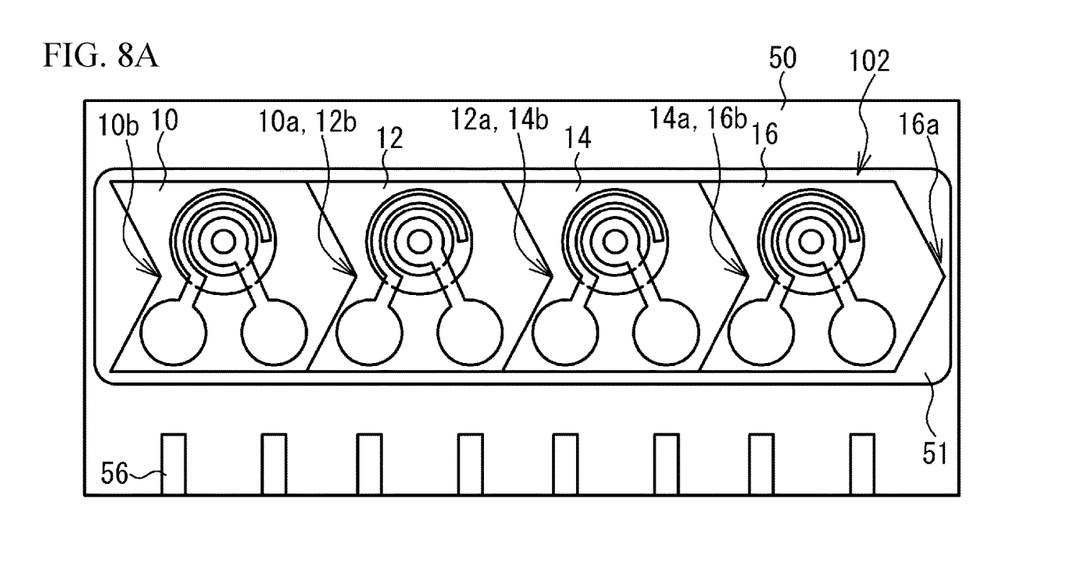
FIG. 8A and FIG. 8B are plan views illustrating a manufacturing method of a light-emitting module.

As illustrated in FIG. 8A, surface-emitting lasers 14 and 16 are arranged in sequence. By bringing the engaging portion 14b into contact with the engaging portion 12a, the position of the surface-emitting laser 14 is determined. By bringing the engaging portion 16b into contact with the engaging portion 14a, the position of the surface-emitting laser 16 is determined. The silver paste 51 is solidified to fix the surface-emitting laser.

Figure 8B:
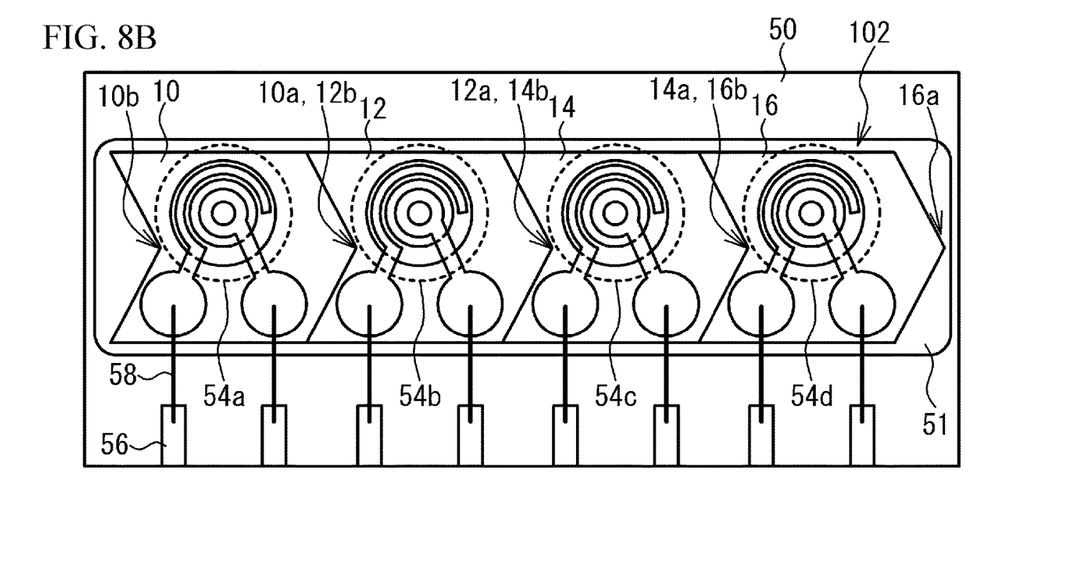

As illustrated in FIG. 8B, pads of the surface-emitting lasers 10, 12, 14 and 16 and the terminals 56 of the substrate 50 are connected by the bonding wires 58. The carrier 52 (illustrated in FIG. 1B) on which the lenses 54a to 54d are formed is bonded to the substrate 50 with a resin or the like. The carriers 52 are positioned such that the lenses 54a to 54d are arrayed in the X-axis direction and the lens 54a is positioned above a mesa of the surface-emitting laser 10, and the lens 54b is positioned above a mesa of the surface-emitting laser 12. The pitch between the lenses is equal to the pitch between mesas of the surface-emitting laser. Thus, by aligning the two lenses 54a and 54b with the mesas of the two surface-emitting lasers 10 and 12, the other lenses 54c and 54d are also placed over mesas of the surface-emitting lasers 14 and 16. The light-emitting module 100 is manufactured by the above steps.

According to the first embodiment, a plurality of the surface-emitting lasers 10, 12, 14 and 16 have engaging portions at their ends. When mounting them on the substrate 50, the engaging portions are engaged with each other. For example, the engaging portion 10a of the surface-emitting laser 10 has the apex 23 protruding outward, the engaging portion 12b of the surface-emitting laser 12 has an apex recessed inward. As illustrated in FIG. 7A, the engaging portion 10a of the surface-emitting laser 10 and the engaging portion 12b of the surface-emitting laser 12 are engaged with each other. It is possible to position the surface-emitting laser 12 easily and accurately by referring to the surface-emitting laser 10. It is possible to position the surface-emitting lasers 12 and 14, as well as the surface-emitting lasers 14 and 16, by engaging the engaging portion of the same shape. Determining the position of the surface-emitting laser 10 also determines the positions of the surface-emitting lasers 12, 14 and 16. Therefore an accuracy of the position of the four surface-emitting lasers is improved.

The length and angle of the sides of the engaging portion may be equal to or different from each other. For accurate positioning, it is preferable that the sum of the angles is 360 degrees and the sides are equal between the engaging portions to be engaged with each other. For example, the sum of the angle θ1 of the engaging portion 10a and the angle of the engaging portion 12b is 360°. The length and angle of a corresponding side of the engaging portion 12b corresponding the side 20 of the engaging portion 12a are equal, and the length and angle of a corresponding side of the engaging portion 12b corresponding to the side 21 of the engaging portion 12b are equal.

By improving the accuracy of the position of the surface-emitting laser, the accuracy of an alignment of the lenses 54a to 54d with the surface-emitting lasers 10, 12, 14 and 16 is also improved. The accuracy of the position of the surface-emitting laser depends on the processing accuracy of the laser dicing in each surface-emitting laser. The machining accuracy is, for example, ±2 μm for each surface-emitting laser. Engaging the two engaging portions causes an error of ±4 μm in the accuracy of the position, and the error is added each time a surface-emitting laser is added. With reference to the surface-emitting laser 10 to be mounted first, the error of the position of the surface-emitting laser 12 is ±4 μm, the error of the position of the surface-emitting laser 14 is ±8 μm, and the error of the position of the surface-emitting laser 16 is ±12 μm. On the other hand, it is preferable that the accuracy of the alignment between one lens and mesa of the corresponding surface-emitting laser is, for example, within ±15 μm. According to the first embodiment, the positional error of the surface-emitting laser is about ±12 μm at the maximum. Therefore, the accuracy of the alignment of a plurality of the surface-emitting lasers with a plurality of the lenses can be kept within the allowable range.

The mesa 39 of each surface-emitting laser functions as an emitting portion for emitting light in the Z-axis direction. The light-emitting module 100 has the lenses 54a to 54d disposed on the +Z side of the mesa 39 of each surface-emitting laser. Since the accuracy of the position of the surface-emitting laser is high, the accuracy of the alignment between the lens and the mesa of the surface-emitting laser is also improved. Thus, it is possible to obtain a desired light output by, for example, condensing the emitted light by a lens.

The four lenses 54a to 54d are provided in the single carrier 52 which is one member. Positioning the carrier 52 over the surface-emitting lasers 10, 12, 14 and 16 aligned in the X-axis direction allows an alignment of the four lenses 54a to 54d with the mesa 39 of each surface-emitting laser. That is, if the two lenses 54a and 54b of the four lenses 54a to 54d are aligned with the mesa 39 of the surface-emitting lasers 10 and 12, an alignment of all the lenses with the mesa 39 is made. Since the alignment does not have to be performed for each lens, man-hours can be reduced. Further, since the four lenses may be molded integrally with one carrier 52, it is possible to reduce the number of parts. Optical components other than the lens may be a mirror, a filter or the like.

Oscillation wavelengths of the surface-emitting lasers 10, 12, 14 and 16 may be different from each other. The array chip 102 having a plurality of oscillation wavelengths may be formed. The lenses 54a to 54d have characteristics suitable for the oscillation wavelength of the corresponding surface-emitting laser. Therefore, a desired light output can be obtained. Two or three of the four oscillation wavelengths may be equal, or the four oscillation wavelengths may be equal.

In a case where a plurality of surface-emitting lasers connected one another are cut out as an array chip, the entire array chip becomes defective when even one of the surface-emitting lasers is defective. The array chip 102 is formed by aligning surface-emitting lasers cut one by one on the substrate 50. The yield of the array chip 102 is improved by performing the inspection of the surface-emitting laser before mounting them on the substrate 50 and by mounting thereon only the non-defective.

In the first embodiment, the number of surface-emitting lasers included in the light-emitting module 100 is four. The number of surface-emitting lasers should be at least two, and may be five or more. It is possible to engage the engaging portion 10b of the surface-emitting laser 10 to an engaging portion 16a of the surface-emitting laser 16. In the first embodiment, one of the two engaging portions of the surface-emitting laser is protruded outward, and the other is recessed inward. The both of the two engaging portions of one surface-emitting laser may be protruded outward when engaging portions of two surface-emitting lasers provided on both sides are recessed. Alternatively, both of the two engaging portions of one surface-emitting laser may be recessed inward when engaging portions of two surface-emitting lasers provided on both sides are protruded. The engaging portion may be provided on ends of a −Y side and a +Y side of the surface-emitting laser. That is, it is sufficient to provide an engaging portion on the outer peripheral surface of the XY plane of the surface-emitting laser. A plurality of surface-emitting lasers are aligned not only in one direction, but may be aligned in a plurality of directions such as the X-axis direction and the Y-axis direction.

Second Embodiment

Figure 9A:
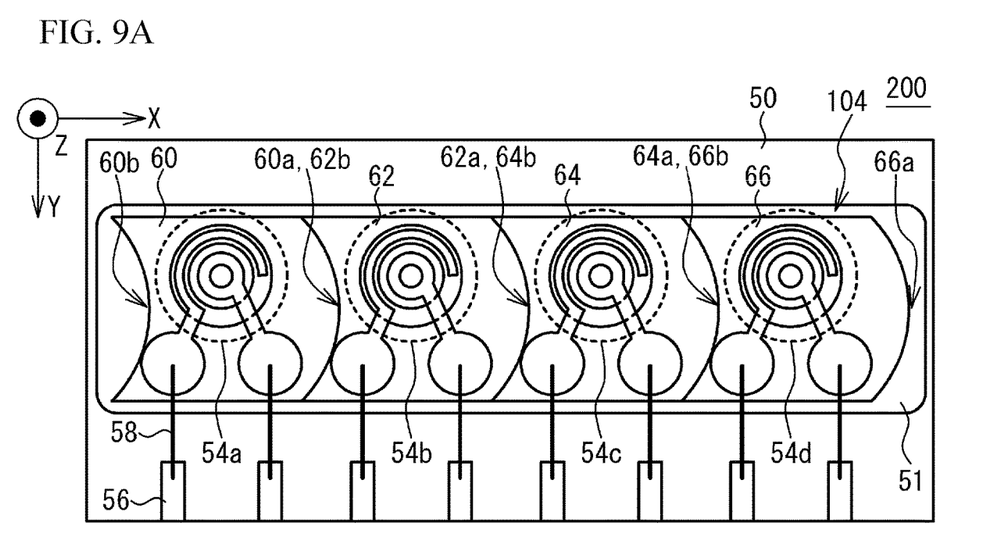
FIG. 9A is a plan view illustrating a light-emitting module according to a second embodiment.

FIG. 9A is a plan view illustrating a light-emitting module 200 according to a second embodiment. Description of the same configuration as that of the first embodiment is omitted. The light-emitting module 200 includes an array chip 104. The array chip 104 includes four surface-emitting lasers 60, 62, 64 and 66.

Figure 9B:
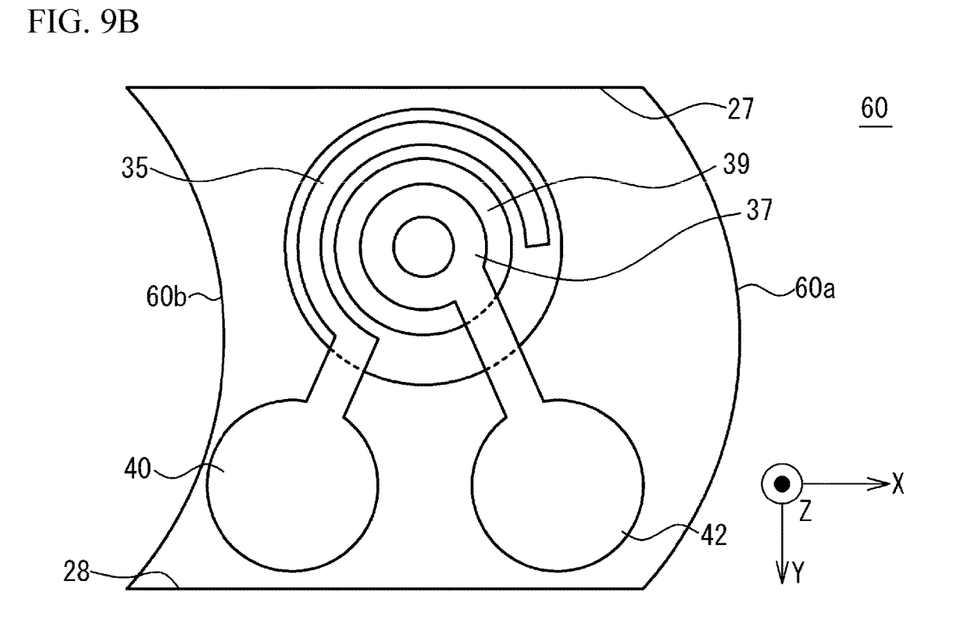
FIG. 9B is a plan view illustrating a surface-emitting laser.

FIG. 9B is a plan view illustrating the surface-emitting laser 60. As illustrated in FIG. 9B, the engaging portion 60a is provided at an end of a +X side of the surface-emitting laser 60, and the engaging portion 60b is provided at the end of a −X side. Engaging portion 60a is arcuate, and is protruded outward. Engaging portion 60b of the −X side is arcuate, and recessed inward. The surface-emitting lasers 62, 64 and 66 have the same configuration as the surface-emitting laser 60. The radius of curvature of each engaging portion is equal to each other.

As illustrated in FIG. 9A, the engaging portion 60a of the surface-emitting laser 60 is engaged with an engaging portion 62b of the surface-emitting laser 62, and an engaging portion 62a of the surface-emitting laser 62 is engaged with an engaging portion 64b of the surface-emitting laser 64. Engaging portion of an engaging portion 64a of the surface-emitting laser 64 is engaged with an engaging portion 66b of the surface-emitting laser 66.

According to the second embodiment, as in the first embodiment, the surface-emitting laser is positioned by engaging the engaging portions of a plurality of surface-emitting lasers. Therefore, the accuracy of the position of the four surface-emitting lasers is improved. As a result, the accuracy of the alignment of the lenses 54a to 54d with the surface-emitting lasers 60, 62, 64 and 66 is also improved.

The radii of curvature of the two engaging portions of one surface-emitting laser may be equal to each other, or may be different. For highly accurate positioning, it is preferable that the engaging portions to be engaged have the same radius of curvature.

Third Embodiment

Figure 10A:
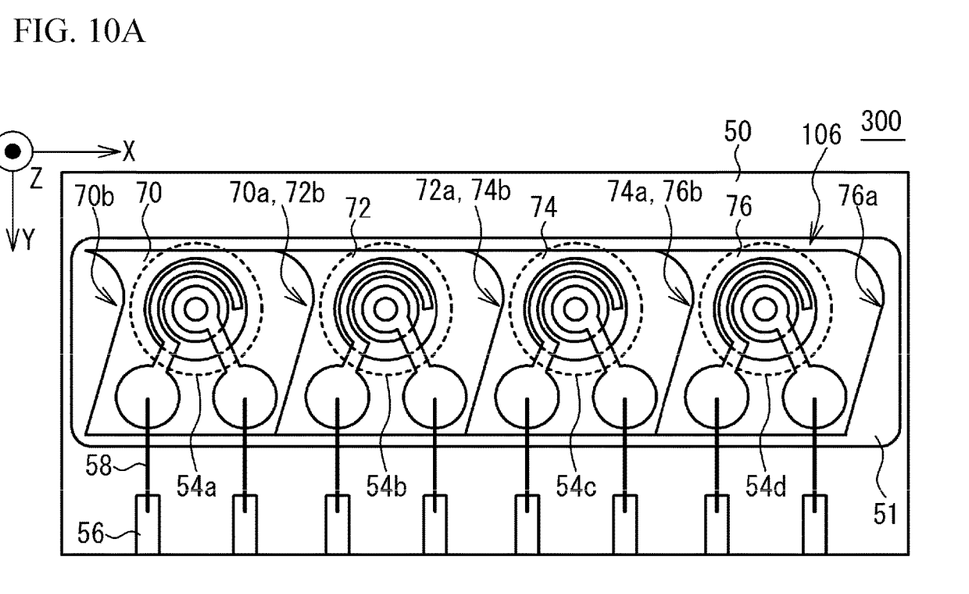
FIG. 10A is a plan view illustrating a light-emitting module according to a third embodiment.

FIG. 10A is a plan view illustrating a light-emitting module 300 according to a third embodiment. Description of the same configuration as that of the first embodiment is omitted. As illustrated in FIG. 10A, the light-emitting module 300 includes an array chip 106. The array chip 106 includes four surface-emitting lasers 70, 72, 74 and 76.

Figure 10B:
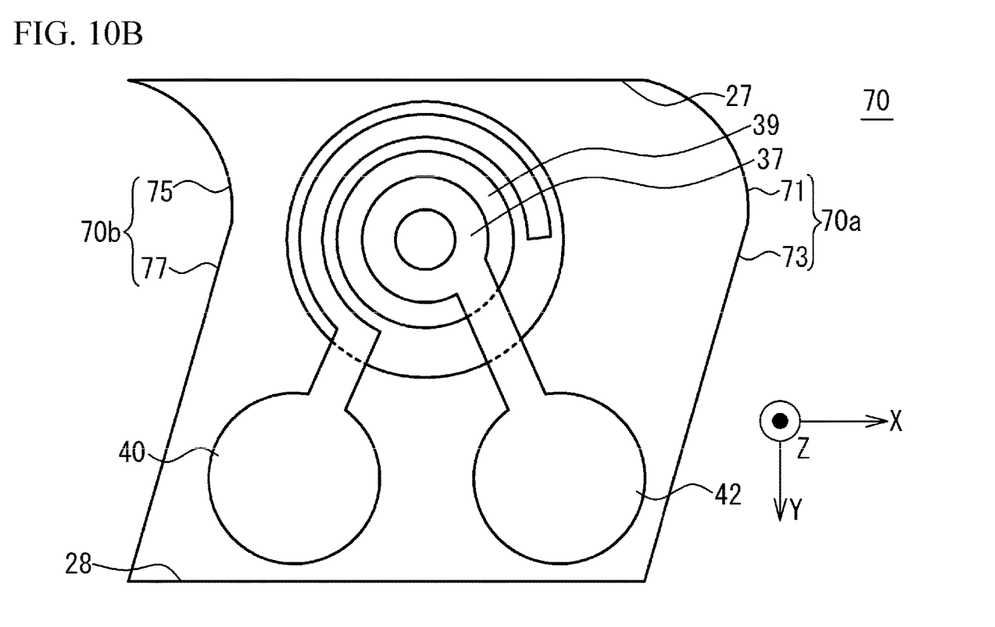
FIG. 10B is a plan view illustrating a surface-emitting laser.

FIG. 10A is a plan view illustrating the surface-emitting laser 70. As illustrated in FIG. 10B, an engaging portion 70a is provided at an end of a +X side of the surface-emitting laser 70, and an engaging portion 70b is provided at an end of a −X side. The engaging portion 70a includes an arcuate curved portion 71 and a straight portion 73 and is protruded outward. The curved portion 71 is located between the side 27 and the straight portion 73, and the straight portion 73 is located between the curved portion 71 and the side 28. The engaging portion 70b includes a curved portion 75 and a straight portion 77, and is recessed inward. The surface-emitting lasers 72, 74 and 76 also have similar configurations.

As illustrated in FIG. 10A, the engaging portion 70a of the surface-emitting laser 70 is engaged with an engaging portion 72b of the surface-emitting laser 72, and an engaging portion 72a of the surface-emitting laser 72 is engaged with an engaging portion 74b of the surface-emitting laser 74. An engaging portion 74a of the surface-emitting laser 74 is engaged with an engaging portion 76b of the surface-emitting laser 76.

According to the third embodiment, as in the first embodiment, the surface-emitting laser is positioned by engaging the engaging portions of a plurality of surface-emitting lasers. Therefore, the accuracy of the position of the four surface-emitting lasers is improved. As a result, the accuracy of the alignment of the lenses 54a to 54d with the surface-emitting lasers 70, 72, 74 and 76 is also improved.

The shapes of the two engaging portions of one surface-emitting laser may be equal to or different from each other. For highly accurate positioning, it is preferable that the shapes of the engaging portions to be engaged are equal to each other.

Fourth Embodiment

Figure 11A:
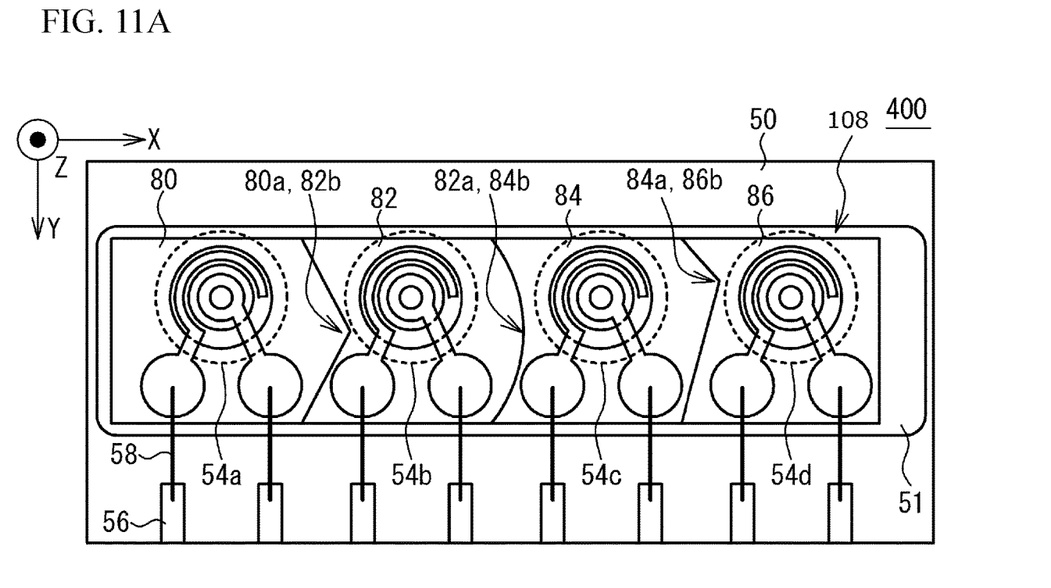
FIG. 11A is a plan view illustrating a light-emitting module according to a fourth embodiment.
Figure 11B:
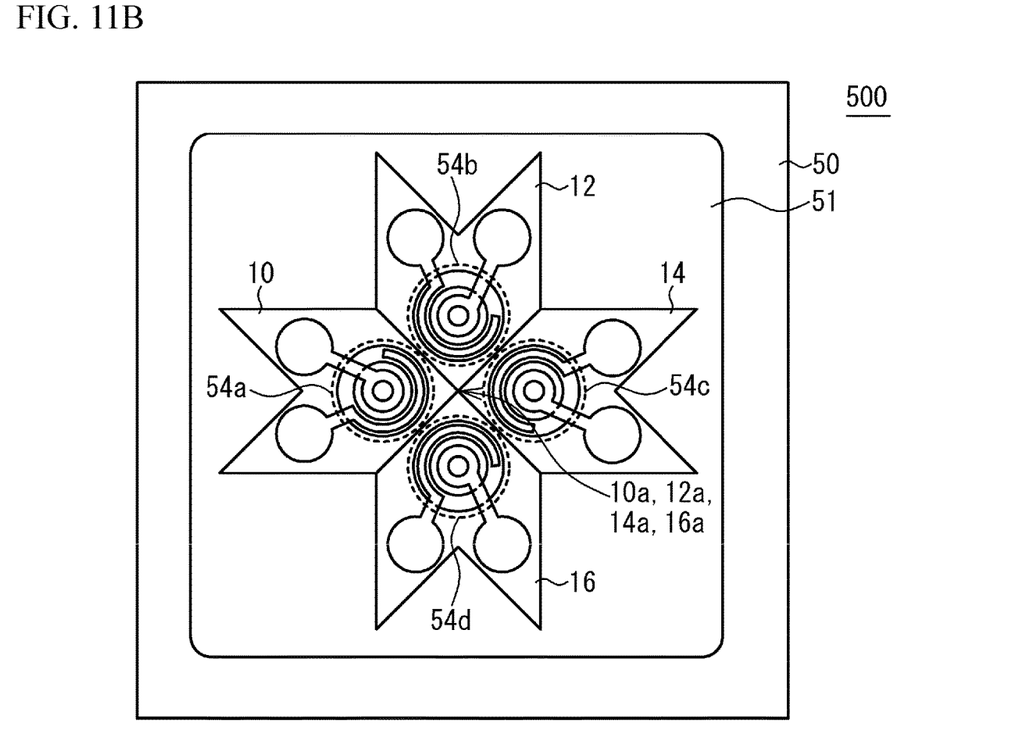
FIG. 11B is a plan view illustrating a light-emitting module according to a fifth embodiment.

FIG. 11A is a plan view illustrating a light-emitting module 400 according to a fourth embodiment. Description of the same configuration as that of Example 1 is omitted. As illustrated in FIG. 11B, the light-emitting module 400 includes an array chip 108. The array chip 108 includes four surface-emitting lasers 80, 82, 84 and 86.

The surface-emitting laser 80 has an engaging portion 80a at the end of a +X side. The surface-emitting laser 82 has an engaging portion 82b at the end of a −X side, and an engaging portion 82a at the end of a +X side. The surface-emitting laser 84 has an engaging portion 84b at the end of a −X side, and an engaging portion 84a at the end of a +X side. The surface-emitting laser 86 has an engaging portion 86b at the end of a −X side.

The engaging portion 80a is protruded outward, having two sides and one apex equal in length as with the engaging portion 10a illustrated in FIG. 2A. The engaging portion 82b is recessed inward and has two sides and one apex equal in length as with the engaging portion 10b illustrated in FIG. 2A. The engaging portion 80a and the engaging portion 82b are engaged with each other. The engaging portion 82a is arcuate and protruded outward. The engaging portion 84b is arcuate and recessed inward. The engaging portion 82a and the engaging portion 84b are engaged with each other. The engaging portion 84a is protruded outward and has two sides different in lengths and an apex. The engaging portion 86b is recessed inward and has two sides different in lengths and an apex. The engaging portion 84a and the engaging portion 86b are engaged with each other. The end of the −X side of the surface-emitting laser 80 and the end of the +X side of the surface-emitting laser 86 extend in the Y-axis direction. An apex and an arc is not provided.

According to the fourth embodiment, as in the first embodiment, the surface-emitting laser is positioned by engaging the engaging portion of a plurality of surface-emitting lasers. Therefore, the accuracy of the position of the four surface-emitting lasers is improved. As a result, the accuracy of the alignment of the lenses 54a to 54d with the surface-emitting lasers 80, 82, 84 and 86 is also improved.

The four surface-emitting lasers 80, 82, 84 and 86 are different in shape, and thus can prevent confusion of the surface-emitting laser. And it is possible to mount the desired surface-emitting laser on the substrate 50. For example, the engaging portion 82a of the surface-emitting laser 82 is arcuate, and the engaging portion 82b has two sides and an apex. The arc-shaped engaging portion 84b is engaged with the engaging portion 82a, and the engaging portion of the other shape is hardly engaged. The engaging portion 80a having two sides and the apex is engaged with the engaging portion 82b, and the engaging portion of the other shape is hardly engaged. Therefore, it is possible to place the surface-emitting laser 80 on the −X side of the surface-emitting laser 82, and place the surface-emitting laser 84 on the +X side.

The fourth embodiment is effective, for example, when the oscillation wavelengths of the four surface-emitting lasers 80, 82, 84, and 86 are different from each other. One shape corresponds to one oscillation wavelength, and the shape differs for each oscillation wavelength. Therefore, surface-emitting lasers with different oscillation wavelengths can be implemented in appropriate locations.

Fifth Embodiment

FIG. 11B is a plan view illustrating a light-emitting module 500 according to a fifth embodiment. Description of the same configuration as that of the first embodiment is omitted. As illustrated in FIG. 11B, the light-emitting module 500 includes an array chip. The array chip has four surface-emitting lasers 10, 12, 14 and 16. The terminals of the substrate 50 are not illustrated. The surface-emitting lasers 12, 14 and 16 are arranged in clockwise order from the surface-emitting laser 10. The engaging portion 10a and the engaging portion 14a are opposed to each other, and the engaging portion 12a and the engaging portion 16a are opposed to each other. The four engaging portions 10a, 12a, 14a and 16a are engaged with each other, and this allows positioning.

The shape of the engaging portion is not limited to those of the embodiments 1 to 5. It is sufficient that the engaging portion protruded outward can be engaged with the engaging portion recessed inward. A tapered shape as with the engaging portion 10a, and a reversed tapered shape widening from an apex as with the engaging portion 12a are preferred. An alignment is possible by sliding the surface-emitting laser in the XY plane and bringing the engaging portions into contact with each other.

Although the embodiments of the present invention have been described above in detail, the present invention is not limited to the specific embodiments, and various modifications and variations are possible within the scope of the gist of the present invention described in the claims.

What is claimed is:

1. A light-emitting module comprising:
  a substrate;
  a first surface-emitting laser mounted on the substrate, the first surface-emitting laser having a first engaging portion protruded outward at an end thereof;
  a second surface-emitting laser mounted on the substrate, the second surface-emitting laser having a second engaging portion recessed inward at an end thereof; and
  a third surface-emitting laser having a third engaging portion at an end thereof,
  wherein
  the first surface-emitting laser and the second surface-emitting laser are adjacent to each other,
  the first engaging portion and the second engaging portion are engaged with each other,
  the second surface-emitting laser has a fourth engaging portion at an end thereof different from the end provided with the second engaging portion,
  the third engaging portion is recessed inward or protruded outward from the third surface-emitting laser, the fourth engaging portion is protruded outward or recessed inward from the second surface-emitting laser, the second surface-emitting laser and the third surface-emitting laser are adjacent to each other, and the third engaging portion and the fourth engaging portion are engaged with each other.

2. The light-emitting module according to claim 1 further comprising:

optical components disposed above the first and second surface-emitting lasers, the optical components configured to receive lights emitted from the first and second surface-emitting lasers.

3. The light-emitting module according to claim 2, wherein each of the first surface-emitting laser and the second surface-emitting laser has an emitting portion from which light is emitted, the optical components include a first lens and a second lens, the first lens is located above the emitting portion of the first surface-emitting laser, and the second lens is located above the emitting portion of the second surface-emitting laser.

4. The light-emitting module according to claim 1, wherein the first surface-emitting laser has an oscillation wavelength different from an oscillation wavelength of the second surface-emitting laser.

5. The light-emitting module according to claim 1, wherein the first engaging portion of the first surface-emitting laser and the second engaging portion of the second surface-emitting laser have one of an apex and an arc, and the fourth engaging portion of the second surface-emitting laser and the third engaging portion of the third surface-emitting laser have the other of the apex and the arc.

6. A method of manufacturing a light-emitting module comprising steps of:

placing a first surface-emitting laser on a substrate, the first surface-emitting laser having a first engaging portion protruded outward at an end thereof;

placing a second surface-emitting laser on the substrate, the second surface-emitting laser having a second engaging portion recessed inward at an end thereof; and placing a third surface-emitting laser on the substrate, the third surface-emitting laser having a third engaging portion at an end thereof, wherein in the step of placing the second surface-emitting laser, the second surface-emitting laser is placed so that the first engaging portion and the second engaging portion are engaged with each other, the second surface-emitting laser has a fourth engaging portion at an end thereof different from the end provided with the second engaging portion, the third engaging portion is recessed inward or protruded outward from the third surface-emitting laser, the fourth engaging portion is protruded outward or recessed inward from the second surface-emitting laser, the second surface-emitting laser and the third surface-emitting laser are adjacent to each other, and in the step of placing the third surface-emitting laser, the third surface-emitting laser is placed so that the third engaging portion and the fourth engaging portion are engaged with each other.

7. The method of manufacturing a light-emitting module according to claim 6 further comprising a step of:

arranging optical components above the first and second surface-emitting lasers after the step of placing the first surface-emitting laser and the second surface-emitting laser, wherein each of the first surface-emitting laser and the second surface-emitting laser has an emitting portion from which light is emitted, the optical components include a first lens and a second lens adjacent to each other, and in the step of arranging the optical components, the first lens is positioned above the emitting portion of the first surface-emitting laser and the second lens is positioned above the emitting portion of the second surface-emitting laser.

* * * * *